(12) United States Patent
Reimann

(10) Patent No.: US 7,471,164 B2
(45) Date of Patent: Dec. 30, 2008

(54) OSCILLATOR AND METHOD FOR OPERATING AN OSCILLATOR

(75) Inventor: Reinhard Reimann, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 11/110,680

(22) Filed: Apr. 21, 2005

(65) Prior Publication Data

US 2005/0237124 A1   Oct. 27, 2005

(30) Foreign Application Priority Data

Apr. 22, 2004   (DE) .................. 10 2004 020 975

(51) Int. Cl.
*H03B 5/18* (2006.01)
(52) U.S. Cl. .................. 331/177 V; 331/185; 331/167; 331/117 R
(58) Field of Classification Search ............. 331/167, 331/34, 177 R, 177 V, 36 C, 117 R, 117 FE; 327/108
See application file for complete search history.

(56) References Cited

U.S. PATENT DOCUMENTS

| | | | |
|---|---|---|---|
| 4,349,811 A | 9/1982 | Brokaw | |
| 4,713,631 A | 12/1987 | Enderby et al. | |
| 5,821,818 A | 10/1998 | Idei et al. | |
| 6,091,304 A | 7/2000 | Harrer et al. | |
| 6,268,778 B1 * | 7/2001 | Mucke et al. | 331/117 R |
| 6,292,066 B1 * | 9/2001 | Shibuya et al. | 331/176 |
| 6,346,899 B1 | 2/2002 | Hadidi et al. | |
| 6,509,805 B2 * | 1/2003 | Ochiai | 331/117 FE |
| 6,650,194 B1 * | 11/2003 | Kertis et al. | 331/117 R |
| 6,657,509 B1 * | 12/2003 | Ohannes | 331/117 R |
| 6,753,738 B1 * | 6/2004 | Baird | 331/25 |
| 7,321,271 B2 * | 1/2008 | Takinami et al. | 331/117 R |
| 2002/0041651 A1 | 4/2002 | Schwarzmueller | |
| 2002/0109553 A1 | 8/2002 | Tran et al. | |

(Continued)

FOREIGN PATENT DOCUMENTS

DE          31 29 797 A1          5/1982

(Continued)

OTHER PUBLICATIONS

David Ruffieux et al., "A low voltage, low power VCO for the 88-108MHZ FM broadcasting band," European Solid-State Circuits, 2003. ESSCIRC '03. Conference on Sep. 16-18, 2003, Piscataway, NJ, USA, IEEE, Sep. 16, 2003, pp. 497-500, XP010677212. ISBN-0-7803-7995-0.

(Continued)

*Primary Examiner*—Robert Pascal
*Assistant Examiner*—Ryan J. Johnson
(74) *Attorney, Agent, or Firm*—Muncy, Geissler, Olds & Lowe, PLLC

(57) ABSTRACT

An oscillator is provided having an oscillator circuit including at least one oscillator circuit inductor and a first oscillator circuit capacitor, whereby the value of the first oscillator circuit capacitor is reversible by means of the first control voltages between different stages. The oscillator is characterized by a first control voltage source, which applies first control voltages with at least three stepwise different values to the first oscillator circuit capacitor. Preferably, the control voltages are generated over a network of current sources and resistors, whereby the network compensates for the thermal response of the oscillator. Further, a method for operating this type of oscillator is presented.

15 Claims, 3 Drawing Sheets

U.S. PATENT DOCUMENTS

2003/0067361 A1* 4/2003 Takahashi et al. ........... 331/176
2003/0090347 A1 5/2003 Losehand et al.
2004/0189417 A1* 9/2004 Fujita .................... 331/177 V

FOREIGN PATENT DOCUMENTS

| DE | 199 58 049 A1 | 6/2000 |
| DE | 100 50 294 A1 | 7/2002 |
| EP | 1 143 551 A1 | 10/2001 |
| JP | 9-93124 A | 4/1997 |
| WO | WO 02/27937 A1 | 4/2002 |

OTHER PUBLICATIONS

Bernd-Ulrich H. Klepser et al., "*A fully integrated sige bipolar 2.4 GHZ bluetooth voltage-controlled oscillator*," Radio Frequency Integrated Circuits (RFIC) Symposium, 2000. Digest of Technical Papers. 2000 IEEE, 2000, pp. 61-64, XP002336012.

Klepser et al., 2000 IEEE Radio Frequency Integrated Circuites Symposium, pp. 61-64.

* cited by examiner

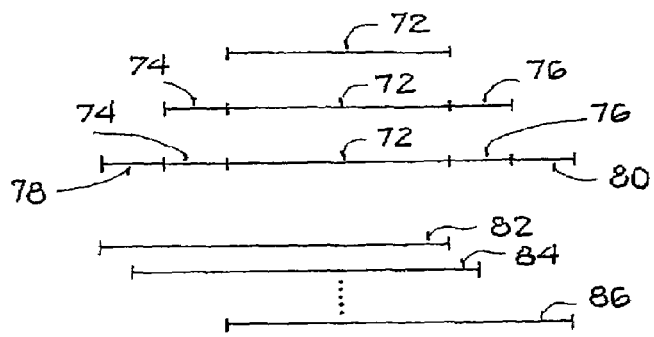
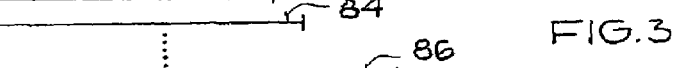
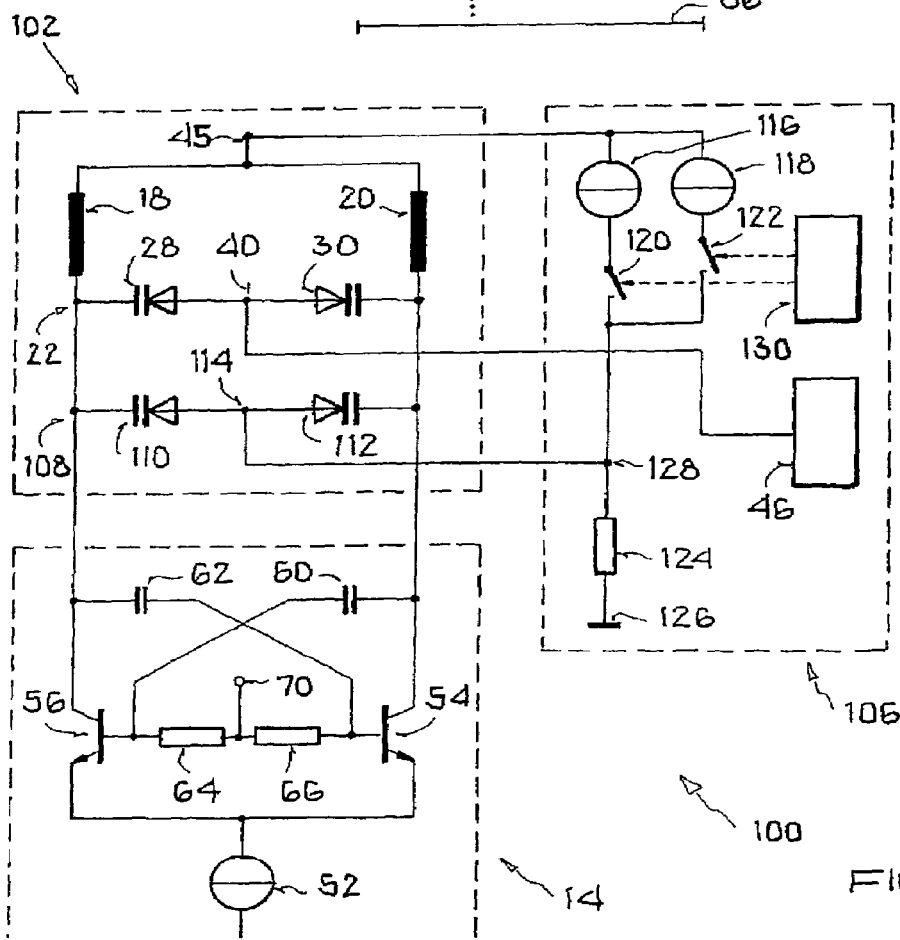

OSCILLATOR AND METHOD FOR OPERATING AN OSCILLATOR

This nonprovisional application claims priority under 35 U.S.C. § 119(a) on German Patent Application No. DE 102004020975.8, which was filed in Germany on Apr. 22, 2004, and which is herein incorporated by reference.

BACKGROUND OF THE INVENTION

1. Field of the Invention

The present invention relates to an apparatus and method for setting a frequency of an oscillator with an oscillator circuit including at least one oscillator circuit inductor and a first oscillator circuit capacitor, whereby the value of the first oscillator circuit capacitor is reversible by first control voltages between different stages.

2. Description of the Background Art

An oscillator whose frequency is controlled by an analog tuning voltage in conjunction with a pair of varactor diodes is known from the article "A Fully Integrated SiGe Bipolar 2.4 GHz Bluetooth Voltage Controlled Oscillator", 2000 IEEE Radio Frequency Integrated Circuits Symposium.

Such oscillator circuits are used, for example, in voltage controlled oscillators and in phase locked loops to generate a signal of a defined frequency. They often have a resonator (oscillator circuit) including a parallel connection of inductive and capacitive components. In such an oscillator circuit, high currents resonate back and forth between the inductor and capacitor at the resonance frequency, whereby only small currents flow in the supply lines. Attenuation losses are compensated by an external connection, which in an ideal case, supplies radiated in-phase and/or Joule loss energy to the oscillator circuit.

Instead of a requirement for a sharply defined, fixed resonance frequency, in technical applications a certain bandwidth is usually required, within which the resonance frequency of the oscillator circuit is to be adjustably controlled. In Bluetooth applications (radio communication over short ranges on the order of several meters), this is, for example, a bandwidth of 0.1 GHz between 2.4 and 2.5 GHz. The desired frequency is usually set by a controlled change in the oscillator circuit capacitor. This oscillator circuit capacitor is often realized by capacitance diodes, which have a control voltage-dependent capacitor.

In addition to this desired dependence, which is utilized for control, unwanted dependencies also occur, which are caused, for example, by fabrication-related variations in component properties and by fluctuating operating temperatures. For this reason, the setting range of the control must also cover the frequency offset due to temperature drifts and fabrication tolerances. In this case, the setting range for the control is determined by the properties of the employed components, for example, by the possible capacitance variation of capacitance diodes and by the circuit properties, particularly by a maximum range of possible control voltages. In mobile communications technology, for example, supply voltages between 3 V and 3.6 V are typical, which greatly limits the possible capacitance variation.

In conventional oscillators, the entire oscillator circuit capacitance is divided into parallel, switchable oscillator circuit capacitors and a capacitor that can be varied via an analog control voltage V_tune. The parallel switchable individual capacitors are connected in a controlled manner to the oscillator circuit or disconnected from the oscillator circuit. This solution has the disadvantage of a high space requirement, because this increases with the number of the capacitors to be connected. In addition, the prior-art circuit does not resolve the problem of temperature dependence or at least resolves it inadequately. A phase noise is always increased when the frequency range selected and to be tuned by means of V_tune is larger than required by a pure tuning range. This is the case when either all capacitors are controlled analogously by V_tune; or the capacitors controlled by V_tune, in addition to the actual tuning range, also experience fabrication tolerance-related and/or temperature drift-induced frequency detuning.

SUMMARY OF THE INVENTION

It is therefore an object of the present invention to provide an oscillator and a method for controlling an oscillator, in which the above-mentioned disadvantages are reduced.

This object is achieved in an oscillator by a first control voltage source, which applies first control voltages with at least three different stepwise values to a first oscillator circuit capacitor.

Accordingly, this object is also achieved by a method of the in that the oscillator circuit capacitor is set by a first control voltage source, which applies the first control voltages with at least three different stepwise values to the first oscillator circuit capacitor.

A switchable control of the same oscillator circuit capacitor, for example, the capacitor of a capacitance diode or a connected pair of capacitance diodes is provided by these features. This solution has the advantage of a rather small space requirement, because many capacitors with small (stepped) values—due to a requirement for maintaining insulation distances—require more space than one large capacitor. The sum of the values of the small capacitors must always be precisely as large as the value of the large capacitor, because otherwise the oscillator circuit would oscillate at a wrong frequency. The invention therefore permits an oscillator circuit control with a reduced number of capacitance diodes, which advantageously lowers the space requirement within the scope of an integrated circuit. In addition, with an increasing number of different cascaded capacitor values, there is the possibility of increasing a number of stepwise variable capacitor values, so that as a result in each case flatter frequency control voltage characteristics for a superimposed intervention of a second control voltage are obtained, which reduces phase noise. This feature will be discussed further below.

In an example embodiment of the oscillator, the first control voltage source has n current sources, which are connected individually switchable to a load resistor, across which the first control voltage drops. In this case, the concept of a resistor covers not only ohmic resistors, but every component or every network of components across which voltage drops in a current flow. The resistor can have, in particular, at least one junction component, for example, a diode. The use of diodes as a resistor component already results in a suitable thermal response or can effect the desired thermal response at least in conjunction with temperature-dependent current sources. The number n of the current sources can be any positive whole number 1, 2, 3 . . . For n=1, the at least three different control voltage values can be generated by turning on different resistors in the circuit of the current source.

Relatively many stepwise different values of a control voltage can be generated by the switchable connection with at least one load resistor through different combinations of relatively few current sources. In addition, the current sources offer the advantage that a temperature response can be impressed upon them with which the temperature response of the capacitor can be compensated.

Another example embodiment includes a first control, which connects either none of the n current sources, precisely one of the n current sources, a combination of all n current sources, or a subcombination of the n current sources to the load resistor.

This embodiment realizes the advantage named in the preceding paragraph of a generation of a large number of control voltages from a relatively small number of current sources.

At least one of the n current sources can output a current dependent on its temperature.

This embodiment realizes the other aforementioned advantage of compensation of the temperature response of the controllable capacitor. It is understood that the selection of the temperature response of the current source takes into account all circuit components, so that the frequency of the oscillator remains stable overall across the temperature.

In another example embodiment, n=two current sources.

In many cases, for example, in applications in mobile communications technology, this small number of current sources leads to a possibility of sufficient control for the capacitor variation. Depending on whether none, one, or two current sources are connected to the load resistor, three control voltage values result. This number can be increased to four when both current sources generate different currents. This applies by analogy to n current sources with an appropriate change in the numerical values.

Therefore, at least two of the n current sources output currents of different strength.

Alternatively, only one current source can be utilized in conjunction with a network of resistors for providing the at least three control voltage values. For this purpose, the current source and/or the network of resistors are preferably selected so that they compensate for the thermal response of the entire oscillator.

Another preferred embodiment is characterized by at least one second oscillator circuit capacitor and a second control, whereby the second control outputs an analog, constantly alterable control voltage, which determines the value of the second oscillator circuit capacitor.

In oscillator circuits, which can be set by another analog control voltage (second control voltage), the effects of the first and second control voltage overlap, so that a certain characteristic is selected from a group of characteristics of frequency-control voltage dependences. This makes it possible to carry out the actual desired frequency setting by an analog, second control voltage and to use the first control voltage to a certain extent to shift this characteristic.

The first and/or the second oscillator circuit capacitor can each be two back-to-back capacitance diodes.

A direct-current decoupling of the control voltage from the oscillator circuit occurs by this symmetric arrangement, in which the analog control voltage is fed in between both diodes. This prevents or at least reduces an unwanted interaction between the oscillator circuit alternating voltage and the analog control voltage.

The second control can be a charge pump of a phase locked loop.

This embodiment integrates the invention into the concept of phase locked loops, so that the other aforementioned advantages can unfold their actions there.

In regard to embodiments of the method, the first control voltage can be generated by a connection of either none of the n current sources, precisely one of the n current sources, a combination of all n current sources, or a subcombination of (n−m) of the n current sources to a load resistor, the combination occurring in each case by control signals of a first control.

A second oscillator circuit capacitor can be controlled by a second control, whereby the second control outputs an analog, constantly alterable control voltage, which determines the value of the second oscillator circuit capacitor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2 shows a range of desired frequencies of the conventional circuit and an unwanted expansion of this range by temperature and fabrication effects;

FIG. 3 shows different frequency ranges, which arise in the circuit according to FIG. 1 by varying a number of connected capacitors;

FIG. 4 illustrates an example embodiment of an oscillator according to the invention;

DETAILED DESCRIPTION

Figure 1:
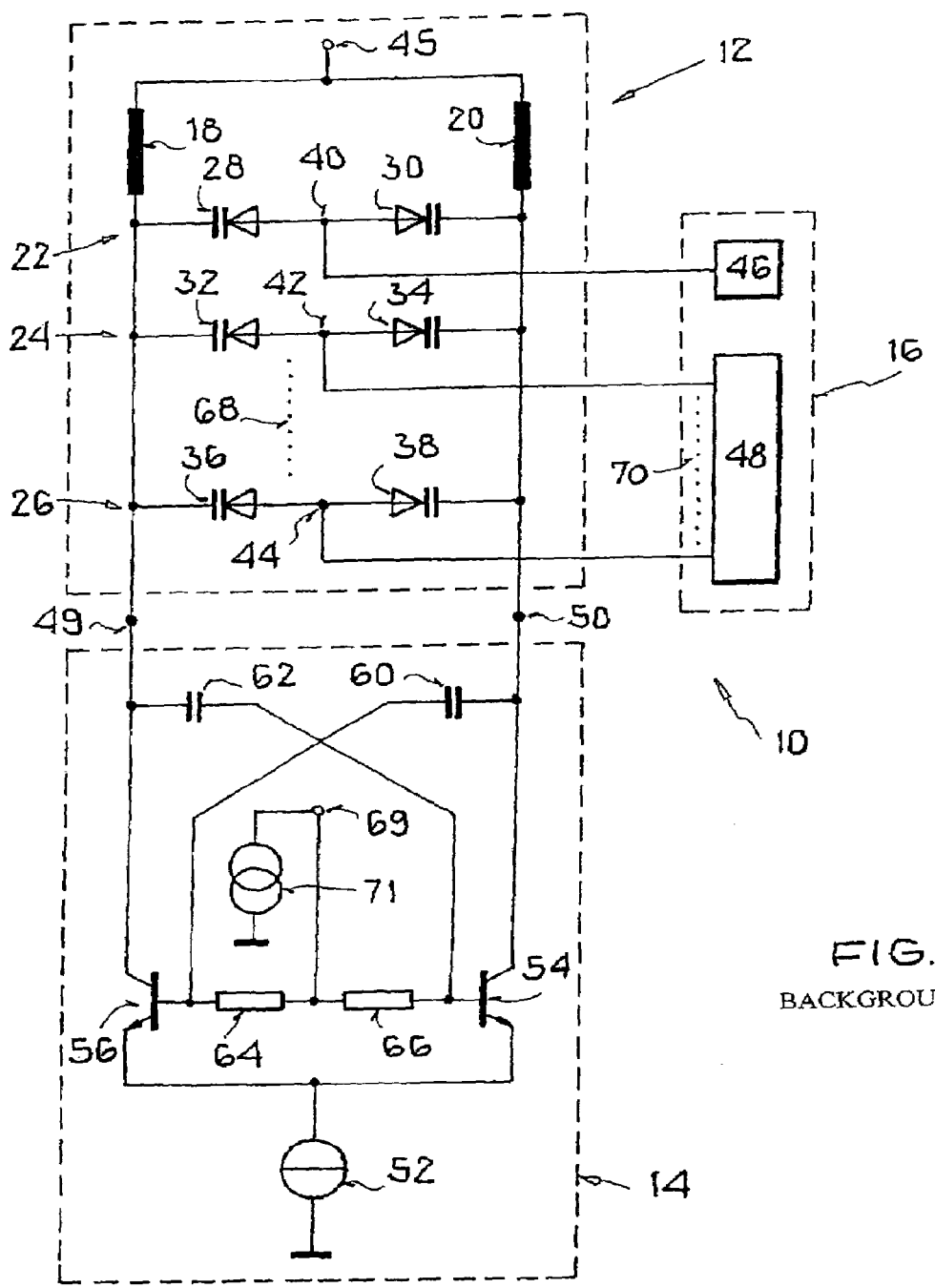
FIG. 1 shows an illustration of a circuit diagram of a conventional circuit.

FIG. 1 shows an overall view of a conventional oscillator 10 having an oscillator circuit 12, a deattenuation circuit 14, and a control 16. The oscillator circuit 12 has a parallel connection including inductors 18, 20 and first capacitors 24 and 26 and a second capacitor 22. Each of the first and second capacitors 22, 24, 26 is made as a pair of back-to-back capacitance diodes or varactor diodes 28, 30; 32, 34, and 36, 38. Each pair 28, 30; 32, 34; 36, 38 of the capacitance diodes has a connection node 40, 42, 44, respectively, via which the control 16 feeds a variable direct voltage to set a voltage-dependent capacitance of each pair of capacitors 28, 30; 32, 34; 36, 38.

A first subcontrol 48 of the control 16 supplies binary voltage values to the nodes 42, 44, so that the associated first capacitors 24, 26 are switched in binary manner between two possible capacitor values in each case. A second subcontrol 46 of the control 16 supplies an analog, constantly alterable direct voltage to the node 40, so that the value of the associated second capacitor 22 is constantly alterable. The oscillator circuit 12 with its inductors 18, 20 and capacitors 22, 24, 26 lies between a supply voltage connection 45 and the deattenuation circuit 14, which is connected via nodes 49, 50 to the oscillator circuit 12. The output signal of the oscillator 10 can also be picked up at nodes 49, 50.

The deattenuation circuit 14 includes a direct current source 52, a pair of transistors 54, 56, a pair of capacitors 60, 62, and a pair of resistors 64, 66. The collector-emitter path of the transistor 54 lies between the node 50 and the direct current source 52. Analogously, the collector-emitter path of the transistor 56 lies between the node 49 and the direct current source 52. The base of the transistor 56 is coupled AC-wise to the node 50 via capacitor 60. Analogously, the capacitor 62 couples the base of the transistor 54 AC-wise with the node 49. The bases of the transistors 54 and 56 are connected via resistors 64 and 66 with the node 69, which is supplied from a voltage source 71 for the operating point adjustment of the transistors 54 and 56.

The deattenuation circuit 14 thus represents an alternating current source with a capacitive cross-coupling of the collectors and bases of a differential pair of transistor 54, 56, which supplies energy to the oscillator circuit 12 via nodes 49, 50 in-phase, and thereby replaces attenuation losses of the oscillator circuit 12.

The dotted lines 68, 70 show that also other (n−2) capacitors can be connected between capacitors 24 and 26, so that n capacitors result, which are connected by the first subcontrol 48.

FIG. 2 shows different frequency ranges, as provided by an oscillator 10 according to FIG. 1. Here, the average frequency range 72 corresponds to the desired frequency spectrum, or a bandwidth of 0.1 gigahertz for a Bluetooth application between 2.4 and 2.5 gigahertz. Depending on the temperature of the oscillator 10, this desired bandwidth 72 is expanded by temperature drift phenomena, which is indicated in FIG. 2 by the laterally expanded ranges 74, 76. An additional expansion occurs due to fluctuations in the electrical properties of the employed components of the oscillator 10, which are caused by the fabrication process. In FIG. 2, such a component-related expansion is shown by lateral ranges 78, 80.

The conventional oscillator 10 according to FIG. 1 is operated so that the first control 48 digitally triggers either none of the first capacitors 24, 26, one of the first capacitors 24, 26, or both of the first capacitors 24, 26. This applies accordingly to the case that additional (n−2) capacitors are located between the capacitors 24, 26. Depending on the switching state defined by the first control 48 of the first capacitors 24, 26, one of the overlapping frequency ranges 82, 84, and 86 depicted in FIG. 3 results. In this case, the first capacitors 24, 26 and the control voltages outputted by the first control 48 for the nodes 42, 44 are dimensioned so that the frequency ranges 82, 84, and 86, overlapping one another, according to FIG. 3 cover the entire frequency spectrum 78, 74, 72, 76, 80 from FIG. 2. The first control 48 thereby selects a subrange 82, 84, 86 of the entire spectrum to be covered 78, 74, 72, 76, 80.

Within one of the preselected ranges 82, 84, 86, the second control 46 by outputting an analog, continuously alterable direct voltage signal to the node 40 of the second capacitor 22 then takes over the task of precisely setting the specifically desired frequency.

As already described above, the conventional oscillator 10, as shown in FIG. 1, has the disadvantage that relatively many space-consuming first capacitors 24, 26 are needed to cover the frequency spectrum 78, 74, 72, 76, 80 with subranges 82, 84, 86. If one is limited to a few first capacitors 24, 26, relatively broad ranges 82, 84, 86 result therefrom, which based on the overall larger tuning range leads to a greater tuning steepness and thus to an unwanted high phase noise. This is explained in further detail in association with FIG. 6.

FIG. 4 shows an oscillator 100 according to an example embodiment of the present invention, which avoids the mentioned disadvantages. The oscillator 100 according to FIG. 4 differs from the conventional oscillator 10 according to FIG. 1, in that a modified oscillator circuit 102 replaces the oscillator circuit 12 of FIG. 1, and in that a modified control 106 replaces the control 16 of FIG. 1. Components that have not been changed are described with the same reference characters in FIG. 1 and FIG. 4 and are therefore not described again in relation to FIG. 4. The modified oscillator circuit 102 is characterized in that the n capacitors 24 to 26 of FIG. 1 have been replaced by a single capacitor 108 having paired back-to-back capacitance diodes 110, 112. The value of this capacitor is varied via a stepwise reversible direct current, which is applied by the modified control 106 to a node 114.

To generate the stepwise alterable direct current for node 114, the control 106 has n direct current sources (n=1, 2, 3, . . . ), of which two direct current sources 116, 118 are shown in FIG. 4 as representative of all n direct current sources. Each of the n-current sources 116, 118 can be connected via individually controllable switches 120, 122 to a load resistor 124, so that in a closed switch 120 and/or 122 a series connection results from current source 116 and/or 118 and load resistor 124, which is located between the supply voltage connection 45 and a ground potential 126. Depending on the switch status of the switches 120, 122, a stepwise variable direct current therefore occurs at a node 128, which is connected connectively with node 114 of the controllable capacitor 108. Alternatively to the connection of several current sources 116, 118 to a load resistor 124, a variation of the control voltage can also be achieved in that a single current source, for example, the current source 116, is connected to a network of resistors 124, whereby the resistor of the network 124 is varied by control of switches 120, 122. In terms of the topology, the one current source can be disposed, for example, at the site of the single resistor 124, whereby resistors can be arranged at a location of the current sources 116, 118. Depending on whether none, one, or both resistors of this type of arrangement are connected to the current flow, three control voltage values also arise at node 114 in this type of embodiment.

The switches 120, 122 are activated by a first subcontrol 130. In contrast to oscillator 10 in FIG. 1, the capacitor of the oscillator circuit 102 of FIG. 4 is not changed by binary turning on or off of capacitors 24, 26, but by variation of the control voltage for a single capacitor 108. The variation of the control voltage occurs in the object of FIG. 4 by turning on or off the currents of the direct current sources 116, 118, which require substantially less room than capacitors 24, 26 of FIG. 1.

The direct current sources 116, 118, together with the switches 120, 122 and optionally the load resistor 124 and the first control 130, represent an exemplary embodiment of a first control voltage source (116, 118, 120, 122), which applies first control voltages with at least three stepwise different values to the first oscillator circuit capacitor (108).

The direct current sources 116, 118 can in each case output the same current strengths or different current strengths. In addition, they are advantageously realized so that their temperature response compensates for the temperature response of the capacitor 108. In the selection of the temperature response of the current sources, all circuit components are considered so that the frequency of the oscillator remains stable above the temperature.

Figure 5:
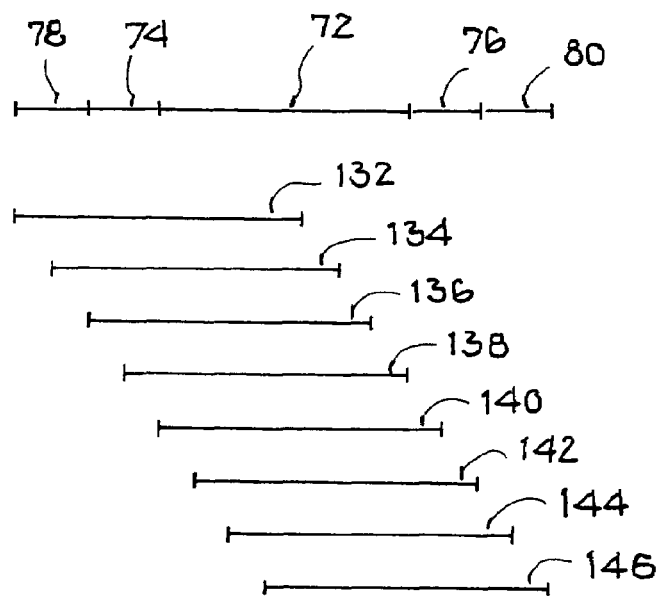
FIG. 5 shows frequency ranges that are in a narrower form in an oscillator of the invention of FIG. 4.

The replacement of the n-capacitors 24, 26 of FIG. 1 by a single capacitor 108 in conjunction with n current sources 116, 118 of FIG. 4, apart from the advantage of the smaller space requirement, has the advantage that the changing of the capacity-determining direct voltage can occur in much finer steps. This is shown in FIG. 5 by a finely stepped division of the entire frequency range 78, 74, 72, 76, 80 by eight frequency subranges 132, 134, 136, 138, 140, 142, 144, and 146, each of which represents a switch status of the n-switch 120, 122 of FIG. 4. Each one of the ranges 132, . . . , 146, can therefore be much narrower than each of the ranges 82, 84, 86 of FIG. 3. The width of the ranges follows directly from the circuitry requirements. The selection of the entire range up to 78+74+72+76+80 is sufficient, but because of this large range, the tuning steepness and thereby the phase noise is high. If fabrication-related variation is considered, it is sufficient to cover the range 74+72+76 (+/−about half of the increment from 82 to 84, . . . ). The lowest phase noise is achieved if the tuning range with temperature compensation covers only the range 72 (+/−about half of the increment from 132 to 134, . . . ).

Eight subranges can be realized, for example, by three current sources and three switches, if the currents of the three current sources are unequal. If, in this case, 1 represents a closed switch and 0 an open switch, the following 8 possible switch states results, which lead to 8 different sum currents and thereby 8 different voltages at the nodes 114, 128. The first control 130 outputs the appropriate data words which establish such switch states. The following table shows the possible switch states for this case.

| Switch position | Switch 1 | Switch 2 | Switch 3 |
|---|---|---|---|
| A | 0 | 0 | 0 |
| B | 1 | 0 | 0 |
| C | 0 | 1 | 0 |
| D | 1 | 1 | 0 |
| E | 0 | 0 | 1 |
| F | 1 | 0 | 1 |
| G | 0 | 1 | 1 |
| H | 1 | 1 | 1 |

It is understood that a pole change is also possible in the arrangement of the current sources 116, 118 and the resistor 124; therefore, the resistor 124 can be connected in countercurrent to node 45 and the current sources 116, 118 in countercurrent to ground 126. The effect of the reduction of the bandwidth of the frequency ranges 132, . . . , 146 leads to the other advantageous result that the characteristic for the analog control intervention of the second control 46 in node 40 of the oscillator circuit 102 is flatter. As a result, the phase noise is reduced thereby, as is evident from FIG. 6. The control voltage U_DC_40, which is applied by the second control 46 to node 40 of the oscillator circuit 12, 102, is plotted on the abscissa of FIG. 6. The frequency ranges 78, 74, 72, 76, 80 from FIGS. 2 and 5 are shown on the ordinate of FIG. 6.

The characteristic 152 belongs to the oscillator circuit 12 from FIG. 1 and describes the extent of the frequency variation of the oscillator circuit 12 for the changes Δ U_DC_40 of the control voltage U_DC_40 within one of the frequency ranges 82, 84, 86 from FIG. 3. In contrast, the characteristic 154 shows the dependence between a change in the frequency f and a change Δ U_DC_40 of the control voltage U_DC_40 in the case of the oscillator 100 of FIG. 4 within one of the frequency ranges 132, . . . , 146.

Figure 6:
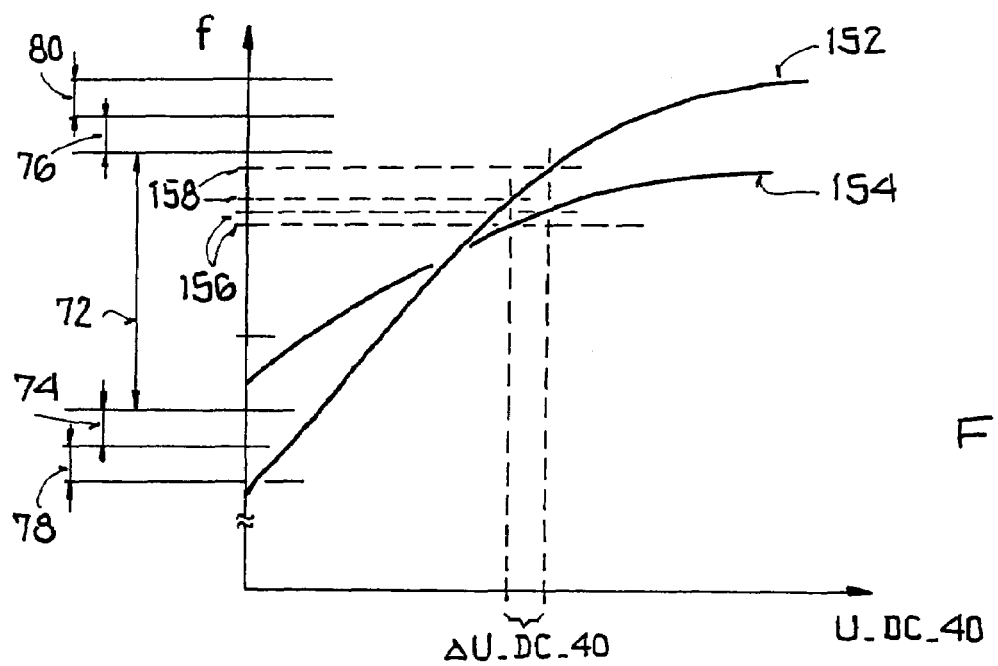
FIG. 6 shows qualitatively an effect of the invention, which results from a larger number of stepwise alterable capacitor values.

Because the frequency ranges 132, . . . , 146 are narrower than the frequency ranges 82, 84, 86, the characteristic 154 of oscillator 100 of FIG. 4 is flatter than the corresponding characteristic 152 of the oscillator 10 of FIG. 1. In each case, the same fluctuation ranges Δ U_DC_40 of the control voltage U_DC_40 therefore with the flatter characteristic 154 result in smaller frequency changes 156, whereas the same fluctuation range Δ U_DC_40 of the control voltage U_DC_40 in the case of the steeper characteristic 152 leads to greater frequency fluctuations 158. Because the frequency changes 156, 158 represent a measure of the phase noise, FIG. 6 shows that the object of FIG. 4 leads to an advantageously smaller phase noise than the conventional art, as described with FIG. 1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit for an oscillator, the circuit comprising:
   at least one inductor;
   a first capacitor circuit, a value of the first capacitor circuit being controllable by a first controller between different values of a single first control voltage; and
   a first control voltage source for applying the single first control voltage, wherein the single first control voltage is selected from at least three different control voltage values and is applied to the first capacitor circuit via a stepwise variable direct current to set a frequency of oscillation.

2. A circuit for an oscillator, the circuit comprising:
   at least one inductor;
   a first capacitor circuit, a value of the first capacitor circuit being controllable between different values of a first control voltage; and
   a first control voltage source for applying the first control voltage, wherein the first control voltage is selected from at least three different control voltage values and is applied to the first capacitor circuit to set a frequency of oscillation,
   wherein the first control voltage source includes n current sources, which are connected individually switchable to a load resistor, across which the first control voltage drops.

3. The circuit according to claim 2, wherein the resistance of a junction component is used as the load resistor.

4. The circuit according to claim 2, wherein a first controller is configured to connect either none of the n current sources, one of the current sources, a combination of all of the n current sources, or a subcombination of the n current sources to the load resistor.

5. The circuit according to claim 2, wherein at least one of the n current sources outputs a current dependent on its temperature.

6. The circuit according to claim 2, wherein n=two current sources.

7. The circuit according to claim 2, wherein at least two of the n current sources output currents having different values from one another.

8. The circuit according to claim 2, wherein only one current source in conjunction with a network of resistors provides the at least three different control voltage values.

9. The circuit according to claim 8, wherein the n current sources and/or the network of resistors compensate for a thermal response of the oscillator.

10. The circuit according to claim 1, further comprising at least one second capacitor circuit and a second controller, wherein the second controller outputs an analog, constantly alterable control voltage, which determines a value of the second capacitor circuit.

11. The circuit according to at least one of claim 10, wherein the first and/or the second capacitor circuit each are formed by two back-to-back capacitance diodes.

12. The circuit according to claim 10, wherein the second controller includes a charge pump of a phase locked loop.

13. A method for setting a frequency of an oscillator with an oscillator circuit, the oscillator circuit including at least one inductor and a first capacitor circuit, the method comprising the steps of:

provising, via a first controller, a single first control voltage to the first capacitor circuit; and changing a value of the first capacitor circuit by the single first control voltage, wherein the single first control voltage is selected from at least three different control voltages and is then applied to the first capacitor circuit via a stepwise variable direct current to change the value of the first capacitor circuit to set the frequency of oscillation.

14. A method for setting a frequency of an oscillator with an oscillator circuit, the oscillator circuit including at least one inductor and a first capacitor circuit, the method comprising the steps of:

providing a first control voltage to the first capacitor circuit; and changing a value of the first capacitor circuit by the first control voltage, wherein the first control voltage is selected from at least three different control voltages and is then applied to the first capacitor circuit via a stepwise variable direct current to change the value of the first capacitor circuit to set the frequency of oscillation, wherein the first control voltage is provided by connecting either no n current sources, one of the n current sources, a combination of the n current sources, or a subcombination of the n current sources to a load resistor, and wherein the connection occurs in each case through a first controller.

15. The method according to claim 13, wherein a second capacitor circuit is controlled by a second controller, the second controller outputting an analog, constantly alterable control voltage, which determines a value of the second capacitor circuit.

* * * * *